(12) United States Patent
Dray

(10) Patent No.: US 8,243,490 B2
(45) Date of Patent: Aug. 14, 2012

(54) MEMORY WITH INTERVENING TRANSISTOR

(75) Inventor: Cyrille Dray, Antibes (FR)

(73) Assignee: Infineon Technologies AG, Neubiberg (DE)

( * ) Notice: Subject to any disclaimer, the term of this patent is extended or adjusted under 35 U.S.C. 154(b) by 318 days.

(21) Appl. No.: 12/627,751

(22) Filed: Nov. 30, 2009

(65) Prior Publication Data

US 2011/0128767 A1 Jun. 2, 2011

(51) Int. Cl.
*G11C 5/06* (2006.01)
(52) U.S. Cl. ............... 365/63; 365/81; 365/82; 365/104
(58) Field of Classification Search .................... 365/63, 365/81, 82, 104
See application file for complete search history.

(56) References Cited

U.S. PATENT DOCUMENTS

| | | | |
|---|---|---|---|
| 6,707,697 B2 | 3/2004 | Dray et al. | |
| 6,844,603 B2 | 1/2005 | Georgakos et al. | |
| 7,457,150 B2 | 11/2008 | Tsuchida et al. | |
| 7,879,643 B2 * | 2/2011 | Lung | 438/95 |
| 2004/0089893 A1 | 5/2004 | Bissey et al. | |
| 2007/0109840 A1 | 5/2007 | Gogl | |
| 2008/0205121 A1 | 8/2008 | Chen et al. | |
| 2009/0207645 A1 | 8/2009 | Parkinson | |

FOREIGN PATENT DOCUMENTS

WO WO2009079660 5/2009

OTHER PUBLICATIONS

Hoberman, "The Emergence of Practical MRAM", Crocus Technology, http://www.crocus-technology.com/pdf/BH%20GSA@20Article.pdf, 2007, 7 pages.
Wikipedia, "Phase-Change Memory", retrieved on Aug. 28, 2009 at http://en.wikipedia.org/wiki/Phase-change_memory, 6 pgs.

* cited by examiner

*Primary Examiner* — Thong Q Le
(74) *Attorney, Agent, or Firm* — Lee & Hayes, PLLC

(57) ABSTRACT

Disclosed herein are memory devices and related methods and techniques. A cell in the memory device may be associated with an intervening transistor, the intervening transistor being configured to isolate the cell from adjacent cells under a first operating condition and to provide a current to a bit line associated with the cell under a second operating condition.

20 Claims, 7 Drawing Sheets

MEMORY WITH INTERVENING TRANSISTOR

BACKGROUND

Embedded non-volatile memory (ENVM), particularly memory which has bidirectional write current capability (also referred to herein as a "bidirectional current memory device"), is becoming increasingly popular as a storage solution. Some examples of ENVM devices include phase change random access memory (PCRAM) and spin torque transfer magnetic random access memory (STT-MRAM). Area density and isolation of memory cells are two issues for ENVM and bidirectional current memory device technology.

Bidirectional current memory devices are common to have multiple columns, each column with one or more bit lines, and multiple rows, each row with and one or more source lines and one or more word lines. Through this architecture, the memory may be read, written, or erased and, as an example, may be erased with a bit line high, source line low, or vice versa. However, in certain configurations there is a gate-to-source voltage drop across the access transistor during access. To compensate for this voltage loss, there is typically a need to overdrive the access gates/transistors. This often requires a charge pump or other device to provide the overdriven voltage. Additionally, according to certain developments in ENVM technology, the source line may be shared with access transistors of adjacent memory cells, which leads to the source line being generally perpendicularly aligned to the bit line and thus unnecessarily providing current to memory cells that are not being accessed.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are nonvolatile memory devices and systems, as well as methods of operating and forming such devices and systems.

According to an embodiment, a memory device includes at least one first cell and at least one second cell, which may form a portion of a memory array. Each cell has a first access transistor including a source, a gate and a drain. The gate of the first access transistor is controlled by a first word line portion. Each cell also has a second access transistor including a source, a gate and a drain. The gate of the second access transistor is controlled by a second word line portion. Moreover, the drain of the second access transistor is coupled to the drain of the first access transistor and to an electrode of, for example, an embedded non-volatile memory (ENVM) dipole. The memory device also includes an intervening transistor. The intervening transistor has a first doped region associated with the first cell of the memory device, a second doped region associated with the second cell of the memory device, and a gate coupled to the first and second word line portions. The intervening transistor is configured to isolate the first cell from the second cell under a first operating condition and to provide a current to a bit line under a second operating condition.

According to an implementation, a memory device cell includes a first access transistor including a gate controlled by a first word line portion and a second access transistor including a gate controlled by a second word line portion. The memory device cell also includes an intervening transistor. The intervening transistor includes a gate coupled to the first and second word line portions and is configured to isolate the cell from adjacent cells in a memory array under a first operating condition and to provide a current to a bit line associated with the cell under a second operating condition.

According to another implementation, a method of operating a bidirectional current memory device is disclosed. The method includes providing a first signal to a word line, the word line configured to provide current to the access transistors of at least two memory cells and to an intervening transistor between the two memory cells. The intervening transistor isolates the two memory cells from each other under a first operating condition and provides a current to a bit line associated with one of the two memory cells under a second operating condition. The method additionally includes providing a second signal to a source line and providing a third signal to the bit line to access the memory cells.

Techniques, including circuits and methods, in accordance with the present disclosure may be implemented in a number of ways. Example environment and context is provided below with reference to the included figures and for the purposes of the ongoing discussion.

Figure 1:
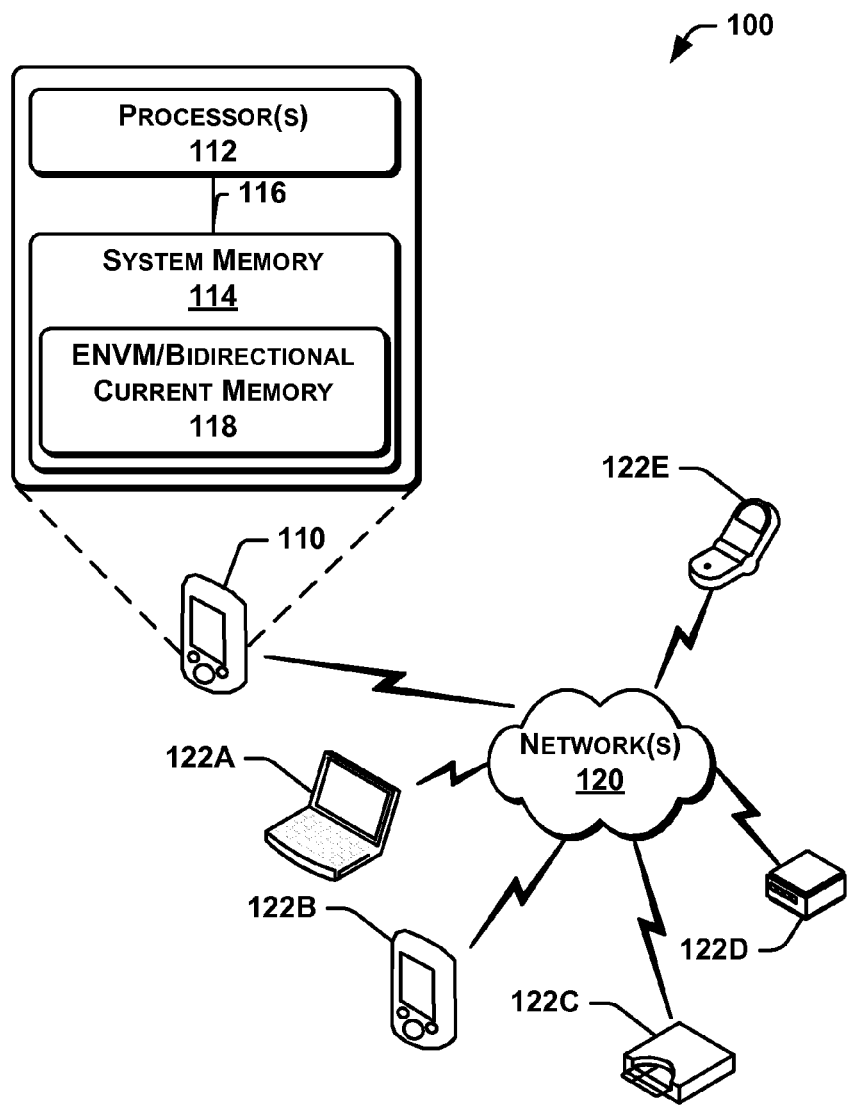
FIG. 1 is an exemplary environment in which techniques in accordance with the present disclosure may be implemented.

FIG. 1 illustrates an exemplary environment 100 in which techniques in accordance with the present disclosure may be implemented. In this implementation, the environment 100 includes a communication device 110, or other mobile and/or electronic device, having one or more embedded nonvolatile memory (ENVM)/bidirectional current memory devices 118 configured in accordance with the teachings of the present disclosure. The communication device 110 operatively communicates via one or more networks 120, such as wireless local area network (WLAN), with a plurality of other devices 122. Alternatively, the communication device 110 may bypass the networks 120 and communicate directly with one or more of the other devices 122. Detailed descriptions of various aspects of EVNM or other memory devices and methods, and techniques are provided in the following sections with reference to FIGS. 2 through 6.

In the representative environment 100, the communication device 110 is a hand-held device, such as an MP3 (Moving Picture Experts Group Layer-3) player, a personal data assistant (PDA), a global positioning system (GPS) unit, mobile telephone, smartphone, or other similar hand-held device, and the other devices 122 may include, for example, a computer 122A, another hand-held device 122B, a compact disc (CD) or digital video disc (DVD) player 122C, a signal processor 122D (e.g., radio, navigational unit, television, etc.), and a mobile phone 122E. In alternative implementations, of course, the devices 110, 122 may include any other suitable devices, and it is understood that any of the plurality of devices 122 may be equipped with ENVM/bidirectional current memory devices 118 that operate in accordance with the teachings of the present disclosure.

As further shown in FIG. 1, the communication device 110 includes one or more processors 112 and one or more system memories 114, such as input/output (I/O) devices (e.g., transceivers, transmitters, receivers, etc.), coupled to a system memory 120 by a bus 116. In the implementation shown in FIG. 1, the ENVM/bidirectional current memory device 118 is included as a component within the system memory 114 of the communication device 110. In alternative implementations, however, the EVNM/bidirectional current memory device 118 may be integrated with any other suitable portion of the device 110, or may be a separate, individual component of the device 110.

The system bus 116 of the communication device 110 represents any of the several types of bus structures, including a memory bus or memory controller, a peripheral bus, an accelerated graphics port, and a processor or local bus using any of a variety of bus architectures.

The system memory 114 and/or EVNM/bidirectional current memory device 118 may include computer-readable media configured to store data and/or program modules for implementing the techniques disclosed herein that are immediately accessible to and/or presently operated on by the processor 112. For example, the system memory 114 and/or EVNM/bidirectional current memory 118 may also store a basic input/output system (BIOS), an operating system, one or more application programs, and program data that can be accessed by the processor 112 for performing various tasks desired by a user of the communication device 110.

Moreover, the computer-readable media included in the system memory 114 and/or EVNM/bidirectional current memory device 118 may include or be associated with media that can be accessed by the device 110, including computer storage media and communication media. Computer storage media may include volatile and/or nonvolatile, removable and/or non-removable media implemented in any method or technology for storage of information such as computer-readable instructions, data structures, program modules, or other data. Computer storage media includes, but is not limited to, and random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 110.

Similarly, communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection and wireless media such as acoustic, RF, infrared and other wireless media. Combinations of any of the above should also be included within the scope of computer readable media.

Generally, program modules executed on the device 110 (FIG. 1) may include routines, programs, objects, components, data structures, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the exemplary environment 100 is shown in FIG. 1 as a communication network, this implementation is meant to serve only as a non-limiting example of a suitable environment for use of bidirectional current memory devices in accordance with present disclosure. Similarly, the device 110 is simply one non-limiting example of a suitable device that may include bidirectional current devices, such as EVNM/bidirectional current memory device 118, in accordance with the present disclosure.

Exemplary Devices

Structural and operational aspects of implementations of memory devices and arrays in accordance with the present disclosure will now be described. For example, a bidirectional current memory device 200 (also referred to herein as simply "memory device"), which may be an ENVM, in accordance with an implementation of the present disclosure is shown in FIGS. 2-6. One skilled in the art of memory design and/or manufacture will readily appreciate that the teachings herein are exemplary only; the techniques disclosed may be applied to other memory devices.

Figure 2B:
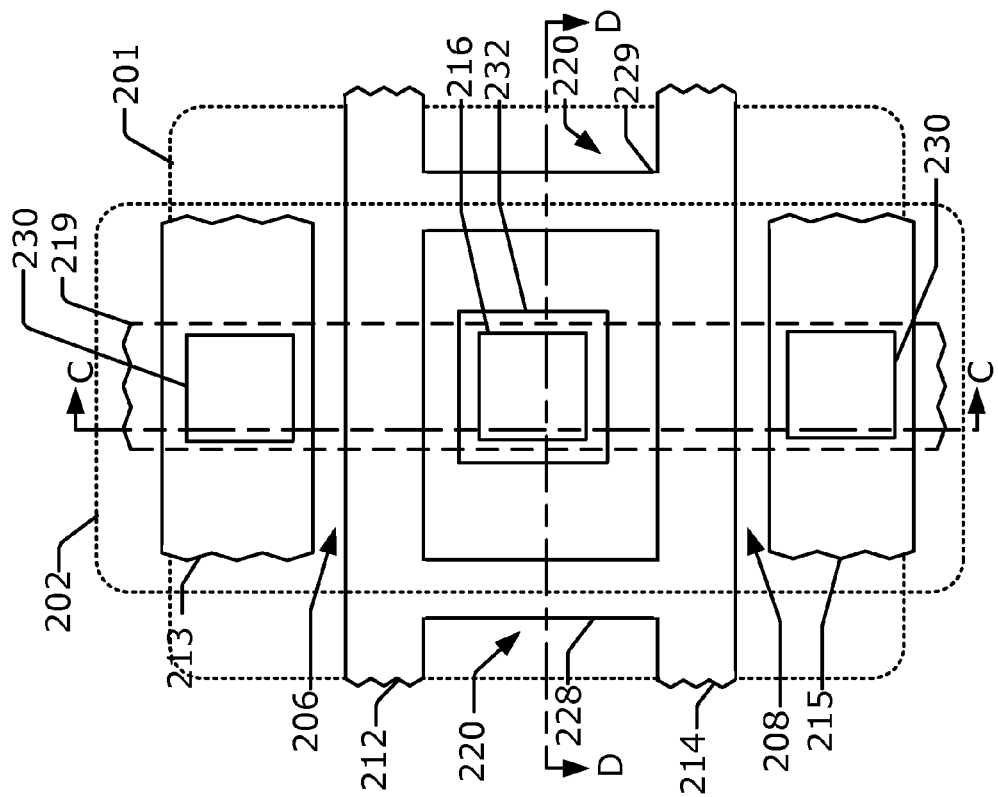
FIG. 2B is a simplified schematic of a top plan view of a portion of the memory device shown in FIG. 2A.
Figure 2A:
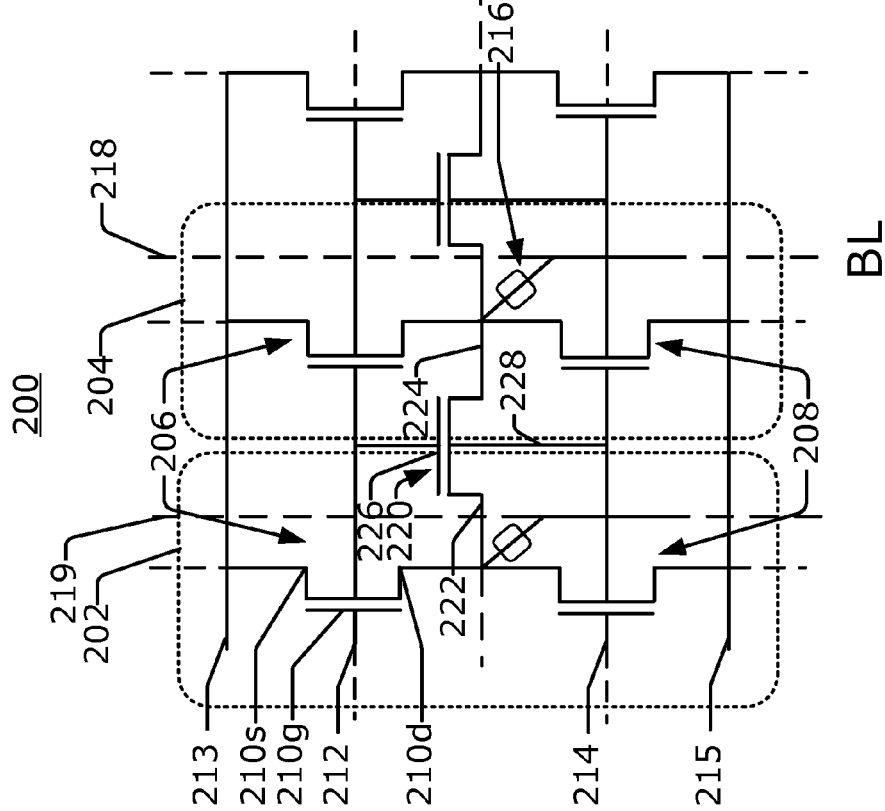
FIG. 2A is a simplified schematic diagram of a memory device according to one implementation.

FIGS. 2A and 2B illustrate an embodiment of a memory device 200, of which only a portion is shown for the sake of simplicity. The memory device 200 includes at least one first cell 202 and at least one second cell 204. Each cell has a first access transistor 206 and a second access transistor 208, each transistor including a source 210$s$, a gate 210$g$, and a drain 210$d$ (reference numbers shown only with one transistor for the sake of simplicity). The gate 210$g$ of the first access transistor 206 is controlled by a first word line portion 212, the gate 210$g$ of the second access transistor controlled by a second word line portion 214. Source lines 213 and 215, which may be coupled to the same signal source, may control the sources 210$s$ of the first access transistor 206 and the second access transistor 208. Moreover, the drain 210$d$ of the second access transistor 208 is coupled to the drain 210$d$ of the first access transistor 206 and to an electrode of an embedded non-volatile memory (ENVM) dipole 216, which is formed between the drains 210$d$ and a bit line 218, as will be shown in greater detail below.

The memory device 200 also includes intervening transistors 220 between adjacent cells (e.g. 202 and 204). The intervening transistor 220 has a path 222, which may be a first doped region in a semiconductor substrate and which is associated with the first cell 202 of the memory device. The intervening transistor 220 also has a path 224, which may be a second doped region associated with the second cell 204 of the memory device. The intervening transistor 220 also has a gate 226, which may be coupled to the first and second word line portions 212 and 214 via path 228.

The intervening transistor 220, which may be a metal oxide semiconductor (MOS) transistor, is configured to isolate the first cell 202 from the second cell 204 under a first operating condition and to provide a current to the bit line 218 under a second operating condition. For example, according to one implementation, the first and second word line portions 212 and 214 operate as a single word line and, by virtue of the path 228, have the same potential for a given operating condition. When the word line 212/214/228 is unselected, such as when a signal having a voltage of 0 V or electrical ground, electrical isolation between adjacent bit lines (e.g. bit line 219) is achieved due to the intervening transistor 220 being in an "off" state (note that only one bit line is shown in FIG. 2A for the sake of simplicity, however, each cell may have its own bit line). When the word line 212/214/228 is selected, such as when a signal having a voltage sufficient to place the intervening transistor 220 into an "on" state is provided, intervening transistors 220 draw current to the selected bit line 218. The advantage of this configuration is that while the intervening transistor 220 provides isolation, a feature currently provided by isolation techniques such as shallow trench isolation (STI), the intervening transistor 220 also allows current to be drawn to the selected bit line 218 when the intervening transistor 220 is in an on-state. This is advantageous particularly for bidirectional current memory devices in which the word lines (e.g. 212 and 214) and source lines (e.g. 213 and 215) are common across a row, i.e., in a generally orthogonal direction to the bit lines 218 and 219, as the device would otherwise be subjected to current loss across unselected cells (e.g. 202 and 204). However, this technique is also applicable to any bidirectional current memory device or other memory device that would benefit from the use of intervening devices that draw current toward the memory cell being address when the intervening device is in a first state, such as an "on" state, and that isolate the cell in a second state, such as an "off" state. The isolation provided by the intervening transistor 220 also permits higher memory cell density than conventional technologies.

One of the first and second doped regions 222 and 224 may be configured to operate as a source and the other of the first and second doped regions 222 and 224 may be configured to operate as a drain of the intervening transistor. Which doped region is serving as the drain or source may be determined by the direction of current across the transistor.

FIG. 2B shows a schematic top plan view of a portion of the memory device 200 shown in FIG. 2A. For example, FIG. 2B shows the first cell 202 including a first access transistor 206, a second access transistor 208, and intervening transistors 220, which are formed in an active region 201, which may be all be formed in a substrate such as a monocrystalline silicon material. Moreover, the first access transistor 206, a second access transistor 208, and intervening transistors 220 may be configured as n-type Field Effect Transistor (n-FET) or p-type Field Effect Transistor (p-FET) devices. Word line portions 212, 214, and path 228 are shown as a first conductive layer, such as a doped polysilicon or other suitable material, and may serve as gate electrodes for transistors 206, 208, and 220, respectively. Source lines 213 and 215 may also be formed of a conductive material, such as a doped monocrystalline silicon or a metallization layer, and may be formed over source contacts 230. A metallization layer 232 may also be formed and may provide a conductive path between a drain contact 234 and the ENVM dipole (not shown, but formed as a stack with the metallization layer 232). A bit line 219 may be coupled to the drain contact via the dipole. The bit line 219 may be formed as a conductive path, such as a metallization layer, for coupling to one terminal of the ENVM dipole.

Figure 2C:
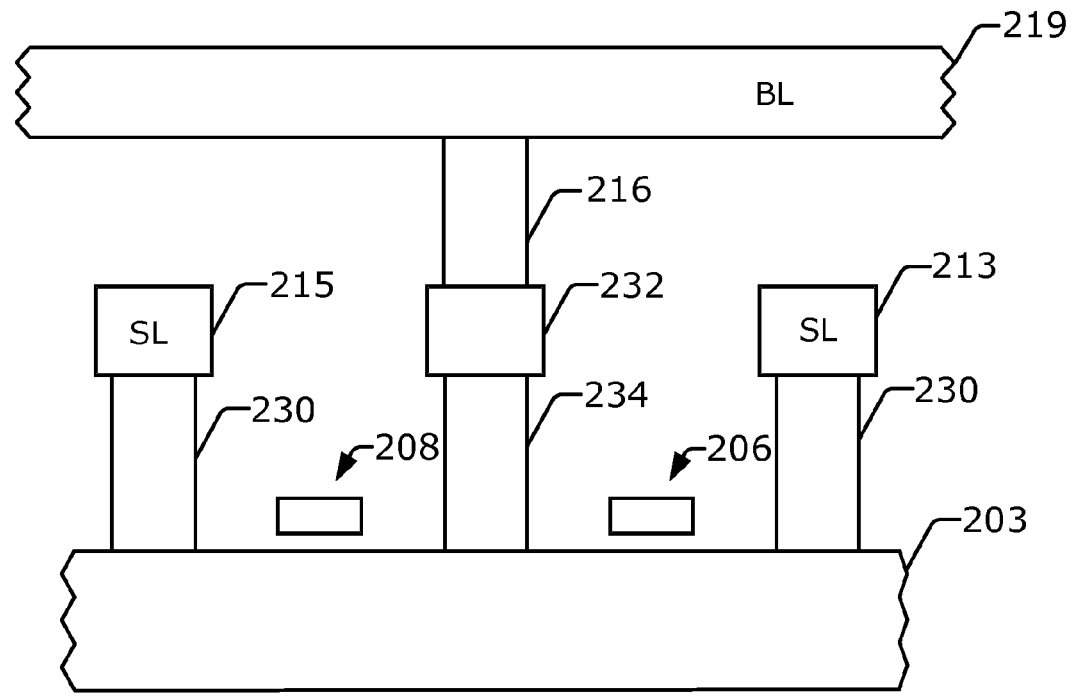
FIG. 2C shows a simplified cross section of the memory device along the lines marked "CC" in FIG. 2B.
Figure 2D:
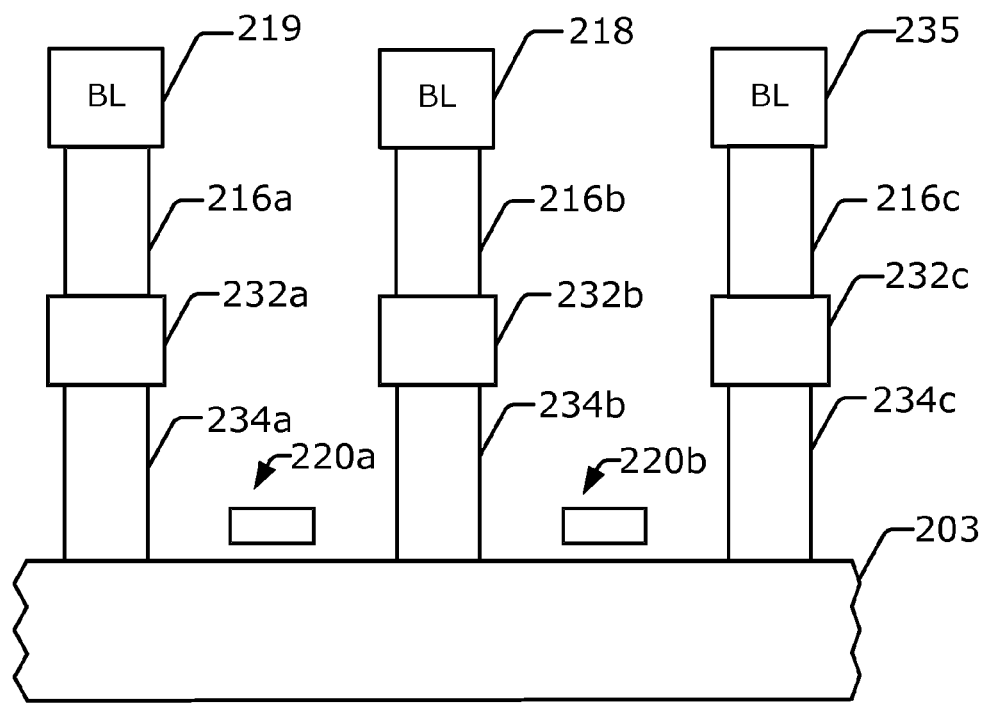
FIG. 2D shows a simplified cross section of the memory device along the lines marked "DD" in FIG. 2B.

FIGS. 2C and 2D show exemplary simplified cross sections along the lines marked "CC" and "DD", respectively, in FIG. 2B. Certain details, such as spacers, gate dielectrics, isolation/insulation layers, word lines and certain doped wells and regions are omitted from FIGS. 2C and 2D for the sake of simplicity and to highlight the arrangement of the bitlines (218, 219, etc.), the source lines (213, 215, etc), the ENVM dipole 216, the access transistors (208, 208, etc.), and the intervening transistors (220a, 220b, etc.). One skilled in the art of memory design and/or manufacture will readily appreciate how the conventional details and features that are not shown would be utilized with regard to the disclosed implementations.

FIG. 2C shows a simplified cross section along the lines marked "CC" in FIG. 2B. Access transistors 206 and 208 are formed on and/or within the substrate 203 in accordance with conventional techniques. Source lines 213 and 215 couple to the substrate and, more particularly, to access transistors 206 and 208, respectively, via contacts 230. The drain regions of access transistors 206 and 208 are coupled to one electrode of the ENVM dipole 216 via the contact 234 and metallization layer 232. The other electrode of the ENVM dipole 216 is coupled to the bitline 219.

In the case of the implementation of STT-MRAM, the dipole 216 includes one or more nano-elements or -layers that are flipped between magnetic states or polarities using an electrical current provided by the bitline 219 and/or the metallization layer 232. The so-called 'spin polarization' is achieved by passing current through one or more of the magnetic nano-elements or layers of the dipole 216, from which only one type of spin flows. The polarized current interacts with one or more of the layers of the dipole 216, which affects the stored magnetization. This permits writing in one direction or another depending on the polarity of the current.

FIG. 2D shows an expanded simplified cross section along the lines marked "DD" in FIG. 2B. More particularly, the cross section shown in FIG. 2D shows an additional bitline 235 in order to highlight the function of the intervening transistors (220a and 220b). For the sake of clarity, the reference numbers have designations "a," "b," and "c" to highlight that they are distinct elements relative to each other. However, it is noted that these designations are arbitrary and offered only for the purpose of understanding the arrangement and operation of the memory device 200, of which a portion in shown in FIG. 2D. As mentioned above with regard to FIG. 2C, one electrode of the ENVM dipole 216a is coupled to the bitline 219. The other electrode of the ENVM dipole 216a is coupled to the metallization layer 232a, which is in further electrical connection with the intervening transistor 220a via contact 234a. The intervening transistor 220a allows current to flow toward the ENVM dipole 216a and bit line 219 when the intervening transistor 220a is in a first state (e.g., an "on" state) and isolates the ENVM dipole 216a and bit line 219 when it is in a second state (e.g., an "off" state). Similarly, the intervening transistors 220a and 220b allow current to flow toward the ENVM dipole 216b and bit line 218 when the intervening transistors 220a and 220b are in a first state (e.g., an "on" state). The intervening transistors 220a and 220b also isolate the ENVM dipole 216b/bit line 218 from the ENVM dipole 216a/bit line 218 and from the ENVM dipole 216c/bit line 235 when the intervening transistors 220a and 220b are in a second state (e.g., an "off" state).

According to certain implementations, the feature size/area of the access transistor devices is approximately 30 $F^2$ or about 0.1352 $\mu m^2$. Moreover, the transistor width to length ratio (W/L) is approximately 680/60, which has a characteristic "on" current of at least about 408 $\mu A$.

Figure 3:
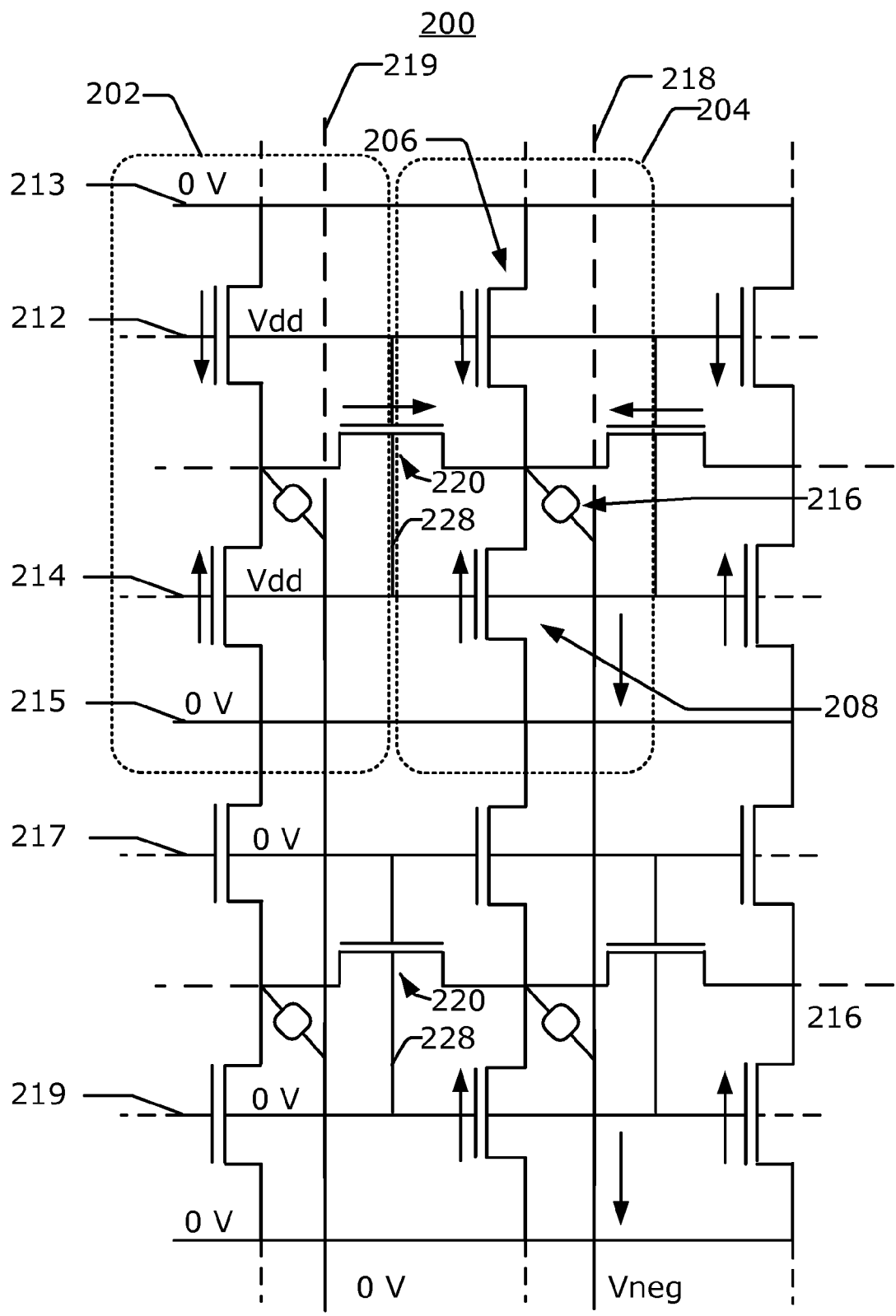
FIG. 3 is a simplified schematic diagram of a memory device according to an implementation for writing to one of the memory cells.
Figure 4:
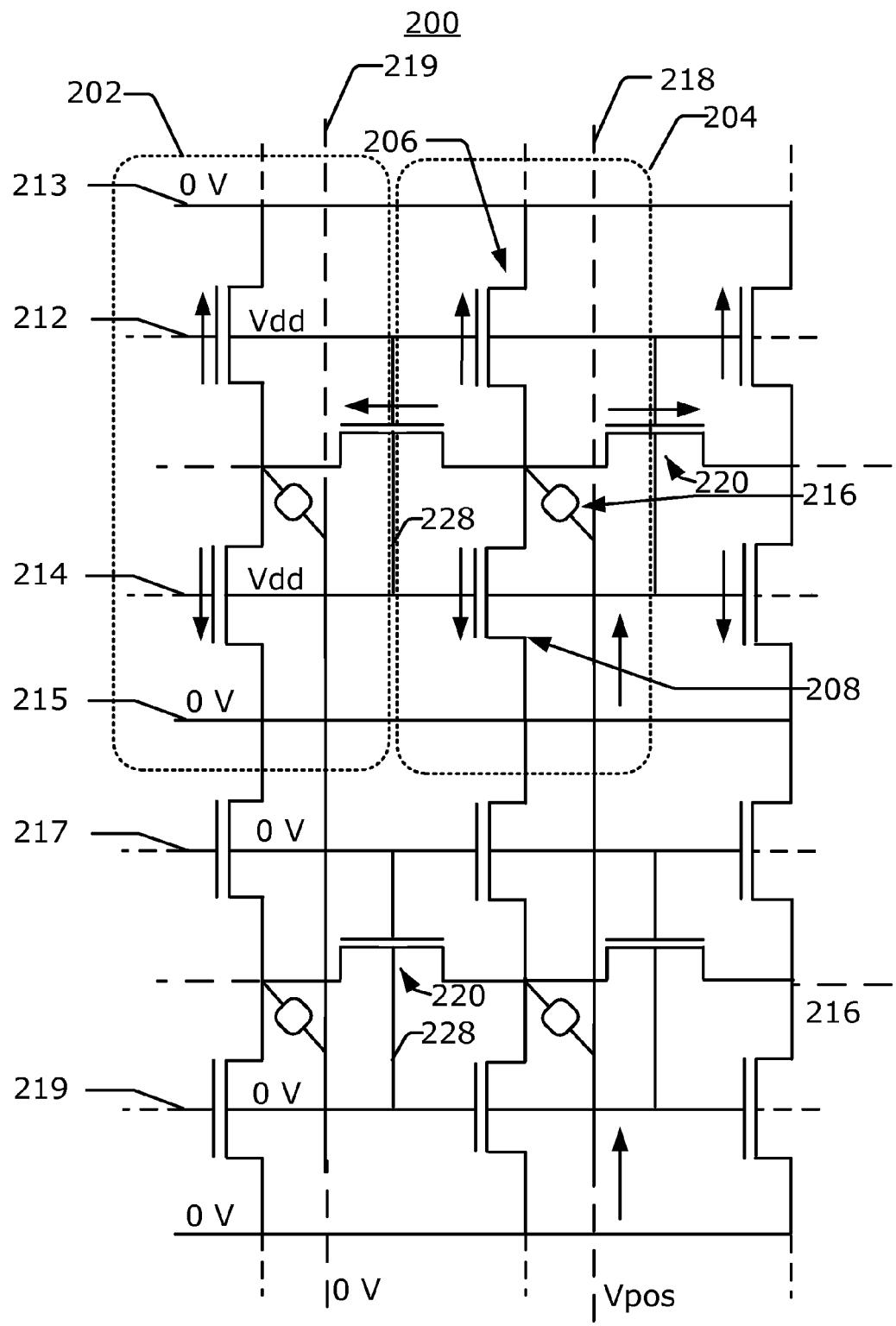
FIG. 4 is a simplified schematic diagram of a memory device according to an implementation for writing to one of the memory cells.
Figure 5:
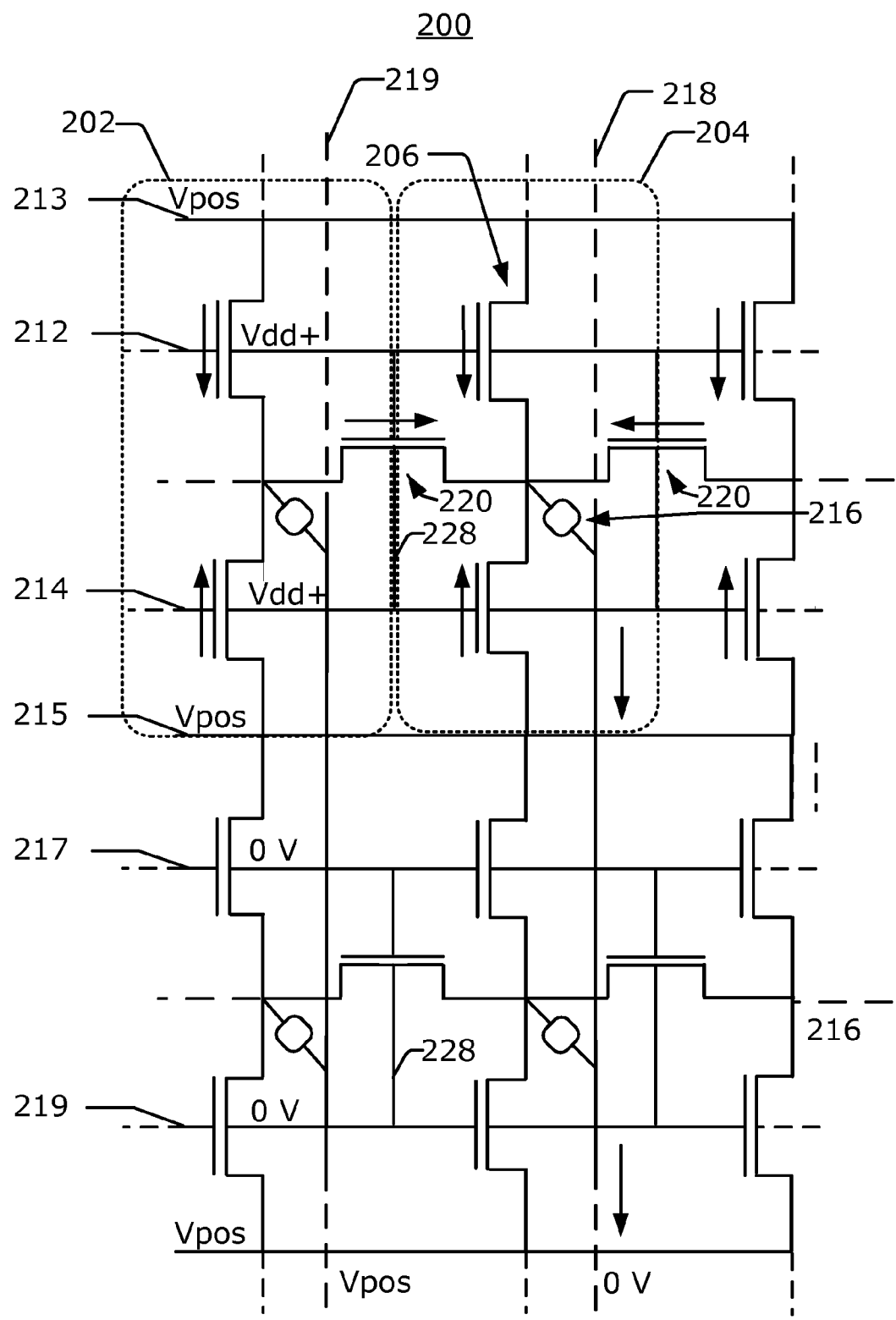
FIG. 5 is a simplified schematic diagram of a memory device according to an implementation for writing to one of the memory cells.

As shown in FIGS. 3-5, bidirectional currents may be used to write a logical "1" or a "0" to one or more memory cells (e.g., 202 and 204) within a bidirectional current memory device 200, of which only a portion is shown for the sake of simplicity. Generally, pulling current toward a given bit line writes a "0", while pulling current away from a given bit line writes a "1," though these are arbitrary designations that may be selected to have essentially any two different values ("off"/ "on", "high"/"low", and so forth). The current flow may be controlled using a positive and/or a negative voltage signal as shown and described herein.

FIG. 3 shows an implementation of a memory cell 204 of memory device 200 being written with or assigned a logical "0" value. The source lines 213 and 215 may be set to 0 volts (V) or electrical ground. Word line portions 212 and 214 may be set to a positive supply voltage (Vdd) and may supply this voltage to gates of transistors 206 and 208. Bit line 218 may be set to a negative voltage (Vneg) and bit line 219 may be set to 0 V or electrical ground. This configuration of signals creates a current flow, which is illustrated by arrows above the gates of the transistors (206, 208, and 220) or along the current paths, which draws current toward the bit line 218. The "0" value may be stored in the dipole 216.

As current flows toward the tied-together drains of transistors 206 and 208, and as the current Vdd is applied to the gate of the intervening transistor 220, current is drawn toward the selected cell 204. Thus, unlike contemporary configurations in which current provided to half-selected cells (e.g. memory cell 202) is lost, the intervening transistor 220 permits the current to pass to the selected cell (e.g. memory cell 204). This reduces or eliminates any overdriving of the transistors 206 and 208 of selected cell 204. Such reduction or elimination of overdriving conserves power and reduces damage to the transistors and other circuitry that would be caused by such overdriving. It is also noteworthy that holding word lines 217 and 219 at 0 V or other selected voltage isolates neighboring memory cells from the current being provided to memory cell 204. The selected voltage may be selected such that the unselected, or nonselected, transistor would not turn "on" even if bitline potential is, or becomes, negative, for example, a negative voltage FIG. 4 shows an implementation of the memory cell 204 being written with or assigned a logical "1" value. As with the configuration shown in FIG. 3, the source lines 213 and 215 may be set to 0 V and the word lines 212 and 214 may be set to Vdd. However, to write a "1" to cell 204, bit line 219 is set to 0 V and bit line 218 is set to a positive voltage (Vpos). This configuration of signals creates a current flow, which is illustrated by arrows above the gates of the transistors (206, 208, and 220) or along the current paths, that draws current away from bit line 218. The "1" value may be stored in the dipole.

FIG. 5 shows an alternative implementation of the memory cell 204 being written with a logical "0" value. The source lines 213 and 215 may be set to Vpos. Word lines 212 and 214 may be set to a positive supply voltage (Vdd+), i.e., a voltage greater than Vpos, and may supply this voltage to gates 206 and 208. Bit line 218 may be set to 0 V or electrical ground and bit line 219 may be set to Vpos. This configuration of signals creates a current flow, which is illustrated by arrows above the gates of the transistors (206, 208, and 220) or along the current paths, that draws current toward the bit line 218. The "0" value may be stored in the dipole as described above.

Exemplary Method

According to another implementation, a method of operating a bidirectional current memory device is disclosed. It should be appreciated that the processes and methods described herein are exemplary of the teachings disclosed herein, and that the present disclosure is not limited to the particular process implementation described with regard to FIG. 6. For example, in alternative implementations, certain acts need not be performed in the order described, and may be modified, and/or may be omitted entirely or performed simultaneously, depending on the circumstances. Moreover, in various implementations, the acts described may be implemented by a computer, controller, processor, programmable device, or any other suitable device, and may be based on instructions stored on one or more computer-readable media or otherwise stored or programmed into such devices. In the event that computer-readable media are used, the computer-readable media can be any available media that can be accessed by a device to implement the instructions stored thereon.

Figure 6:
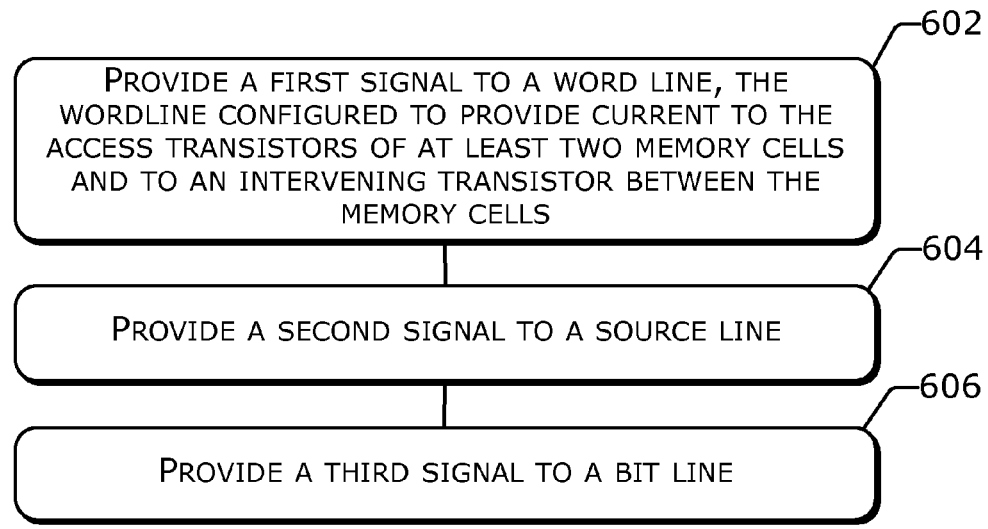
FIG. 6 is a flow diagram of an implementation of a method for operating a bidirectional memory device.

FIG. 6 illustrates a method of operating a bidirectional current memory, such as writing to a ENVM dipole using bidirectional currents.

At 602, a first signal is provided to a word line (e.g. 212 and 214). The word line is configured to provide current to the access transistors (e.g. 206 and 208) of at least two memory cells (e.g. 202 and 204) and to an intervening transistor 220 between the two memory cells. According to an implementation, the intervening transistor 220 isolates the two memory cells (e.g. 202 and 204) from each other under a first operating condition and provides a current to a bit line 218 associated with one of the two memory cells (e.g. memory cell 204) under a second operating condition. The first operating condition includes the word line (e.g. 212 and 214) being set to 0 volts (V) or electrical ground such that the intervening transistor is in an "off" state and the second operating condition includes the word line receiving a positive voltage signal such that the intervening transistor is in an "on" state.

At 604, a second signal is provided to a source line (e.g. 212 and 214). At 606, a third signal is provided to a bit line (e.g. 212 and 214). According to an exemplary method, and under the second operating condition, when the second signal is set to 0 volts (V) or electrical ground and the third signal is set to a negative voltage, a logical "0" value is stored by the cell (e.g. 204) associated with the bit line (e.g. 218). According to another exemplary method, and under the second operating condition, when the second signal is set to 0 volts (V) or electrical ground and the third signal is set to a positive voltage, a logical "1" value is stored by the cell (e.g. 204) associated with the bit line (e.g. 218). According to yet another exemplary method, and under the second operating condition, when the second signal is set to a positive voltage and the third signal is set to 0 volts (V) or electrical ground, a logical "0" value is stored by the cell (e.g. 204) associated with the bit line (e.g. 218).

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

What is claimed is:

1. A memory device comprising:
at least one first cell and at least one second cell, each cell comprising
a first access transistor including a source, a gate, and a drain, the gate of the first access transistor controlled by a first word line portion, and
a second access transistor including a source, a gate, and a drain, the gate of the second access transistor controlled by a second word line portion,
the drain of the second access transistor being coupled to the drain of the first access transistor; and an intervening transistor comprising a first doped region associated with the first cell, a second doped region associated with the second cell, and a gate coupled to the first and second word line portions, the intervening transistor configured to isolate the first cell from the second cell under a first operating condition and to provide a current to a bit line under a second operating condition.

2. The memory device of claim 1, wherein the first and second word line portions operate as a single word line and have the same potential for a given operating condition.

3. The memory device of claim 2, wherein the first operating condition includes the word line being unselected.

4. The memory device of claim 2, wherein the second operating condition includes the word line being selected.

5. The memory device of claim 1, wherein the bit line is associated with the second cell and, under the second operating condition, the first and second access transistors of the first cell provide current to the bit line associated with the second cell.

6. The memory device of claim 1, wherein one of the first and second doped regions is configured to operate as a source and the other of the first and second doped regions is configured to operate as a drain of the intervening transistor.

7. The memory device of claim 1, wherein the drains of the first and second access transistors are connected to an electrode of an embedded non-volatile memory (ENVM) dipole.

8. The memory device of claim 1, wherein the memory device is a bidirectional current memory device.

9. The memory device of claim 1, wherein the source of first access transistor of the first cell is configured to receive the same signal as the source of the first access transistor of the second cell.

10. A memory device cell comprising:
a first access transistor including a gate controlled by a first word line portion, and
a second access transistor including a gate controlled by a second word line portion; and
an intervening transistor comprising a gate coupled to the first and second word line portions, the intervening transistor configured to isolate the cell from adjacent cells in a memory array under a first operating condition and to provide a current to a bit line associated with the cell under a second operating condition.

11. The memory device of claim 10, wherein the first operating condition includes the word line being set to 0 volts (V) or electrical ground such that the intervening transistor is in an "off" state.

12. The memory device of claim 10, wherein the second operating condition includes the word line receiving a positive voltage signal such that the intervening transistor is in an "on" state.

13. The memory device of claim 10, wherein the first and second access transistors are connected to an electrode of an embedded non-volatile memory (ENVM) dipole.

14. A bidirectional current memory device comprising the memory device cell of claim 10.

15. A method of operating a bidirectional current memory device, the method comprising:
providing a first signal to a word line, the word line configured to provide current to the access transistors of at least two memory cells and to an intervening transistor between the two memory cells, the intervening transistor isolating the two memory cells from each other under a first operating condition and providing a current to a bit line associated with one of the two memory cells under a second operating condition;
providing a second signal to a source line; and
providing a third signal to the bit line.

16. The method of claim 15, wherein the first operating condition includes the word line being set to 0 volts (V) or electrical ground such that the intervening transistor in an "off" state.

17. The method of claim 15, wherein the second operating condition includes the word line receiving a positive voltage signal such that the intervening transistor is in an "on" state.

18. The method of claim 17, wherein under the second operating condition, when the second signal is set to 0 volts (V) or electrical ground and the third signal is set to a negative voltage, a logical "0" value is stored by the cell associated with the bit line.

19. The method of claim 17, wherein under the second operating condition, when the second signal is set to 0 volts (V) or electrical ground and the third signal is set to a positive voltage, a logical "1" value is stored by the cell associated with the bit line.

20. The method of claim 17, wherein under the second operating condition, when the second signal is set to a positive voltage and the third signal is set to 0 volts (V) or electrical ground, a logical "0" value is stored by the cell associated with the bit line.

* * * * *